United States Patent [19]
Kashida

[11] Patent Number: 5,729,325
[45] Date of Patent: Mar. 17, 1998

[54] PELLICLE FOR A MASK OR SUBSTRATE

[75] Inventor: Meguru Kashida, Annaka, Japan

[73] Assignee: Shin-Etsu Chemical Co., Ltd., Tokyo, Japan

[21] Appl. No.: 789,425

[22] Filed: Jan. 29, 1997

[30] Foreign Application Priority Data

Jan. 30, 1996 [JP] Japan .................. 8-035536

[51] Int. Cl.$^6$ .................. G03B 27/52; G03B 11/04; G02B 7/00
[52] U.S. Cl. .................. 355/30; 359/511; 428/14
[58] Field of Search .................. 399/220; 355/30, 355/53; 428/14; 359/507, 511

[56] References Cited

U.S. PATENT DOCUMENTS 5,529,819  6/1996  Campi .................. 355/30 X
5,616,927  4/1997  Kubota et al. .................. 355/53 X

FOREIGN PATENT DOCUMENTS

4021863 A1  1/1992  Germany .
3-025442    2/1991  Japan .
5-289314   11/1993  Japan .

OTHER PUBLICATIONS

Patent Abstracts of Japan, vol. 18, No. 228, Apr. 25, 1994.

*Primary Examiner*—Fred L. Braun
*Attorney, Agent, or Firm*—Millen, White, Zelano & Branigan, P.C.

[57] ABSTRACT

A pellicle for a mask or substrate including a frame having one end surface and another end surface and a membrane extended over the frame on the one end surface side. A channel is formed in the other end surface of the frame. The channel is filled with a layer of a tackifier capable of expanding upon heating and/or light irradiation such that the tackifier layer does not protrude outward beyond the other end surface of the frame in an unexpanded state, but protrudes outward beyond the other end surface of the frame when expanded. No liner is attached to the tackifier layer.

8 Claims, 1 Drawing Sheet

;
PELLICLE FOR A MASK OR SUBSTRATE

BACKGROUND OF THE INVENTION

1. Field of the Invention

This invention relates to a pellicle having a membrane extended over a frame and more particularly, to a pellicle having a membrane extended over a frame on one end surface side and a tackifier layer formed on another end surface in such a manner as to eliminate a liner which is conventionally attached to the tackifier layer.

2. Prior Art

In accordance with the recent advance of semiconductor devices toward higher density and integration, patterns have become extremely finer so that any fine foreign matter deposited on a photomask can be a defect. It is then therefore a common practice to mount a pellicle on a photomask in order to prevent any foreign matter from depositing on the photomask.

The pellicle generally includes a frame of metal or resin and a membrane. The membrane is extended over the frame by attaching the membrane to one end surface of the frame with adhesive. A tackifier layer is formed on another end surface of the frame for subsequent attachment to a reticle and covered with a releasable liner or separator for protection.

On use, the pellicle is secured to a photomask or reticle by peeling the liner off to expose the tackifier layer, placing the pellicle on the photomask at a predetermined position, and pressure bonding the exposed tackifier layer to the photomask.

On shipment of pellicles of the above-mentioned construction, after pellicle membranes are inspected to confirm the absence of foreign matter, the pellicles are placed in a special container, which is closed to form a seal tight enough to prevent entry of any foreign matter. The container is then transported to a destination where the package is opened to take out the pellicles. When the pellicle membranes are inspected again at this point, foreign matter is often found on the membranes.

Deposition of foreign matter occurs for the following reason. Since vibrations and impacts occur during transportation by vehicles such as trucks, freight trains and aircraft and loading and unloading on various occasions, foreign matter which lies dormant on parts other than the pellicle membrane leaves there and deposits on the pellicle membrane. Other places where foreign matter is latent are the outer and inner side surfaces of the pellicle frame and the surface of the liner used for protecting the tackifier layer. Especially the liner which is a plastic film coated with a release agent tends to be electrically charged. As a result, microparticulates are attracted to the liner surface. Such microparticulates will transfer from the liner to the pellicle membrane. Additionally, since the liner is punched out of a sheeting in conformity to the frame geometry using a punching machine, cut sections of the punched liner are often accompanied by debris.

SUMMARY OF THE INVENTION

An object of the present invention is to provide a novel and improved pellicle which eliminates a liner which is a latent source of foreign matter.

According to the invention, there is provided a pellicle comprising a frame having one end surface and another end surface and a membrane extended over the frame on the one end surface side. A channel is formed in the other end surface of the frame. The channel is filled with a layer of a tackifier capable of expanding upon heating and/or light irradiation such that the tackifier layer does not protrude outward beyond the other end surface of the frame in an unexpanded state, but protrudes outward beyond the other end surface of the frame when expanded. The expanded tackifier layer serves for attachment of the pellicle to a reticle. No liner is attached to the tackifier layer.

Since the expandable tackifier layer is formed within the channel, there is no need for a liner to protect the tackifier layer. When it is desired to adhesively secure the pellicle to a reticle, the tackifier layer is heated and/or irradiated with light. Then the tackifier layer is expanded to increase its volume whereby the tackifier layer which has been accommodated within the channel bulges to protrude outward beyond the other end surface of the frame. The bulged tackifier layer serves to adhesively bond the pellicle to the reticle. Since the invention eliminates a need for a liner, there exists no foreign matter associated with the liner. The invention prevents the pellicle membrane from detracting from its performance due to contamination by foreign matter. The material cost and the steps and expense of punching, cleaning, and inspection required for the liner are unnecessary.

BRIEF DESCRIPTION OF THE DRAWINGS

These and further features of the present invention will be apparent with reference to the following description and drawings, wherein.

DESCRIPTION OF THE PREFERRED EMBODIMENT

Figure 1:
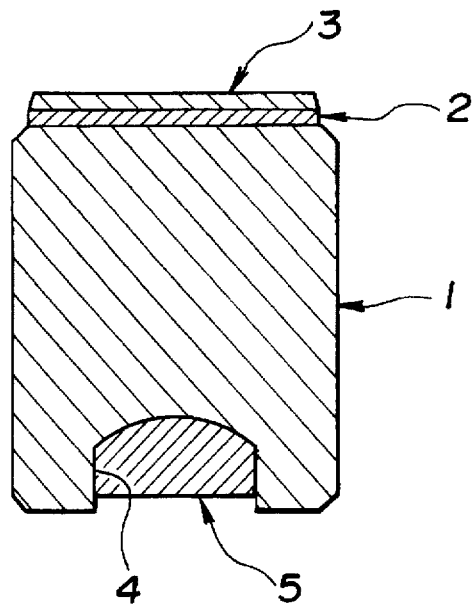
FIG. 1 is a schematic cross-sectional view of one side of a pellicle according to one embodiment of the invention, showing a tackifier layer before expansion.
Figure 2:
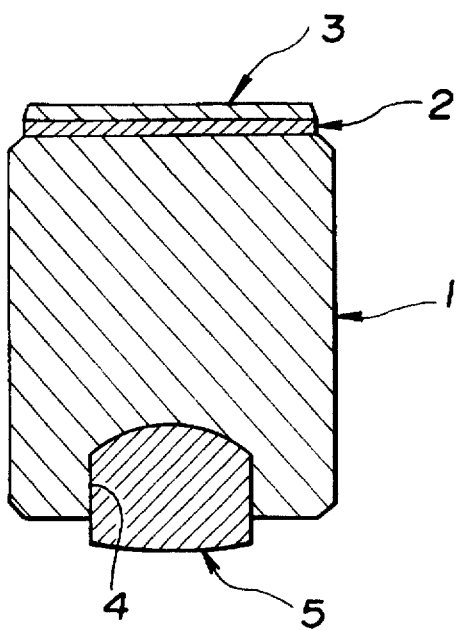
FIG. 2 is a similar view to FIG. 1 showing the tackifier layer after expansion.

As shown in FIG. 1, the pellicle of the invention includes a pellicle frame 1 which is generally rectangular in cross section and has a pair of end surfaces and a pair of side surfaces. An adhesive layer 2 lies on one end surface or top surface of the pellicle frame 1. A pellicle membrane 3 extends over the frame with the membrane periphery attached to the adhesive layer 2. The pellicle frame 1 at the other end surface or bottom surface is provided with a channel or recess 4. The channel 4 is filled with a tackifier layer 5 capable of expanding upon heating and/or light irradiation such that the tackifier layer 5 does not protrude outward beyond the other end surface of the frame 1 in an unexpanded state, but protrudes outward beyond the other end surface of the frame 1 as shown in FIG. 2 when expanded.

The tackifier used herein is not critical insofar as it is capable of expanding or foaming upon heating and/or light irradiation. Rubber base tackifying compositions and acrylic tackifying compositions may be used although silicone base tackifier compositions are preferred from the standpoints of light resistance and chemical resistance. Means for expanding the base resin upon heating and/or light irradiation may be a source of nitrogen, hydrogen or carbon dioxide gas. Where the tackifier must be crosslinked, UV radiation is irradiated to crosslink the tackifier before heat is applied for expansion.

The expandable silicone tackifier composition which can be used herein includes a composition comprising a wellknown silicone tackifier and a resin containing a gasifiable blowing agent (for example, Expancell manufactured by Nippon Ferrite K.K.) and a silicone tackifier composition comprising a dimethylpolysiloxane end-blocked with a silanol group, a dimethylhydrogensiloxane having a SiH group, and a platinum catalyst wherein the catalyst promotes dehydrogenation reaction to give off hydrogen gas for expansion.

No particular limit is imposed on the geometry, width, and depth of the channel in the pellicle frame to be filled with the tackifier. For a pellicle frame whose other end surface has a width of 2 mm, for example, a channel of about 0.5 to 1.5 mm wide may be formed continuously or discontinuously along the entire periphery of the pellicle frame in a linear or zigzag fashion. The channel may have a depth of about 0.5 to 5 mm. The channel may have a suitable cross-sectional shape such as rectangular, semi-circular, U- and V-shaped.

The amount of the tackifier before blowing and the blowing magnification are preferably determined such that the tackifier layer as expanded may protrude beyond the other end surface of the pellicle frame by a distance of about 0.1 to 3 mm, especially about 0.3 to 1 mm.

In the pellicle of the invention, prior to blowing, the tackifier layer 5 accumulates in the recess or channel 4 indented in the other end surface of the pellicle frame without protruding beyond the other end surface. The absence of a liner gives rise to no problem of handling when the pellicle is placed in or taken out of a container. When the tackifier layer is expanded, it increases its volume so that the tackifier layer is bulged beyond the other end surface of the pellicle frame. This state is the same as the prior art pellicle after the liner is peeled off. Then the pellicle of the invention can be attached under pressure to a photomask or reticle in the same manner as the prior art pellicle.

EXAMPLE

Examples of the present invention are given below by way of illustration and not by way of limitation.

The pellicle frame used was a generally rectangular aluminum frame having outer dimensions of 122×149 mm and a generally rectangular cross section (see FIG. 1) with a width of 2 mm and a height of 5 mm. The lower (or other) end surface of the pellicle frame was provided at the center with a channel with a width of 1.2 mm and a depth of 3 mm. The channel was continuously extended along the four sides of the rectangular frame.

The channel was filled with a tackifier such that the tackifier might not protrude outward beyond the end surface. The tackifier used herein was a solventless silicone tackifier composition comprising dimethylpolysiloxane terminated with a silanol group, dimethylhydrogensiloxane having a SiH group, and a catalyst in the form of a platinum-dimethylpolysiloxane complex.

Adhesive was applied to the upper (or one) end surface of the pellicle frame. A thin film of fluoro-polymer was extended over the pellicle frame as the pellicle membrane by adhesively bonding its periphery to the upper end surface. There was prepared a pellicle without a liner.

The pellicle was placed in a special container which was sealed closed. The pellicle was subject to a transportation test by loading the container on a truck and driving the trucks 500 km. After the test, the pellicle was taken out of the container. Foreign matter on the pellicle membrane was observed in the dark room using a focusing lamp to find no increase of foreign matter.

Next, the tackifier was heated at 80°C. for 5 minutes using an infrared heater. The tackifier expanded to increase its volume at a blowing magnification of 1.4. The outer surface of the tackifier protruded 0.5 mm beyond the other end surface of the frame. At the end of blowing, the frame was pressed against a glass substrate of synthetic quartz under a pressure of 15 kg for 3 minutes to form a uniform joint between the tackifier layer and the glass substrate.

Since the pellicle of the present invention does not require a liner, it is free from foreign matter originating from the liner. The invention prevents the pellicle membrane from detracting from its performance due to contamination by foreign matter and eliminates the extra step and expense required for the liner.

Although some preferred embodiments have been described, many modifications and variations may be made thereto in the light of the above teachings. It is therefore to be understood that within the scope of the appended claims, the invention may be practiced otherwise than as specifically described.

I claim:

1. A pellicle comprising a frame having one end surface and another end surface, a membrane extended over said frame on the one end surface side, a channel formed in the other end surface of said frame, and a layer of a tackifier capable of expanding upon heating and/or light irradiation filled in said channel such that the tackifier layer does not protrude outward beyond the other end surface of the frame in an unexpanded state, but protrudes outward beyond the other end surface of the frame when expanded, no liner being attached to the tackifier layer.

2. The pellicle of claim 1 wherein said tackifier is an expandable silicone tackifier.

3. The pellicle of claim 1, wherein the tackifier capable of expanding upon heating and/or light irradiation comprises a silicone tackifier and a resin containing a gasifiable blowing agent.

4. The pellicle of claim 1, wherein the tackifier capable of expanding upon heating and/or light irradiation comprises a dimethylpolysiloxane end-blocked with a silanol group, a dimethylhydrogensiloxane having a SiH group and a platinum catalyst which promotes dehydrogenation to give off hydrogen gas for expansion.

5. The pellicle of claim 1, wherein the channel has a width of about 0.5 to 1.5 mm and a depth of about 0.5 to 5 mm.

6. The pellicle of claim 1, wherein the amount and extent of expansion of the tackifier are selected so that it protrudes beyond the other end surface of the frame by a distance of about 0.1 to 3 mm.

7. The pellicle of claim 1, wherein the amount and extent of expansion of the tackifier are selected so that it protrudes beyond the other end surface of the frame by a distance of about 0.3 to 1 mm.

8. The pellicle of claim 1, wherein the cross-sectional shape of the channel is rectangular, semi-circular, U-shaped or V-shaped.

* * * * *